(12) United States Patent
Marbella et al.

(10) Patent No.: US 10,937,709 B2
(45) Date of Patent: Mar. 2, 2021

(54) SUBSTRATES FOR SEMICONDUCTOR PACKAGES

(71) Applicant: Infineon Technologies AG, Neubiberg (DE)

(72) Inventors: Carlo Marbella, Singapore (SG); Kheng-Jin Chan, Singapore (SG)

(73) Assignee: Infineon Technologies AG, Neubiberg (DE)

( * ) Notice: Subject to any disclaimer, the term of this patent is extended or adjusted under 35 U.S.C. 154(b) by 93 days.

(21) Appl. No.: 16/245,363

(22) Filed: Jan. 11, 2019

(65) Prior Publication Data

US 2020/0227330 A1 Jul. 16, 2020

(51) Int. Cl.
| | |
|---|---|
| *H01L 23/31* | (2006.01) |
| *H01L 23/00* | (2006.01) |
| *H01L 21/683* | (2006.01) |
| *H01L 21/48* | (2006.01) |
| *H01L 21/56* | (2006.01) |

(52) U.S. Cl.
CPC ...... *H01L 23/3114* (2013.01); *H01L 21/4832* (2013.01); *H01L 21/561* (2013.01); *H01L 21/6835* (2013.01); *H01L 24/12* (2013.01); *H01L 24/32* (2013.01); *H01L 24/48* (2013.01); *H01L 24/97* (2013.01)

(58) Field of Classification Search
CPC ..... H01L 23/3114; H01L 24/32; H01L 24/48; H01L 24/97; H01L 24/12; H01L 21/561; H01L 21/4832; H01L 21/6835; H01L 23/3128; H01L 2224/73265; H01L 2224/16225; H01L 23/49822; H01L 23/49816; H01L 2924/15159; H01L 2924/181; H01L 2224/32225; H01L 2924/18301; H01L 22/30; H01L 2924/00012

See application file for complete search history.

(56) References Cited

U.S. PATENT DOCUMENTS

| | | | |
|---|---|---|---|
| 2002/0079593 A1* | 6/2002 | Huang | ................ H01L 23/3672 257/778 |
| 2005/0255634 A1 | 11/2005 | Yilmaz et al. | |
| 2011/0111562 A1 | 5/2011 | San Antonio et al. | |
| 2013/0082258 A1 | 4/2013 | Azzopardi et al. | |
| 2015/0130037 A1 | 5/2015 | Puschner et al. | |
| 2016/0005663 A1 | 1/2016 | Khoo et al. | |

* cited by examiner

*Primary Examiner* — Jasmine J Clark
(74) *Attorney, Agent, or Firm* — Dicke, Billig & Czaja, PLLC

(57) ABSTRACT

A substrate includes a dielectric layer, a first metal bar, a plurality of first traces, a plurality of first openings, a second metal bar, and at least one second opening. The dielectric layer has a first major surface and a second major surface opposite to the first major surface. The first metal bar is on the first major surface. The plurality of first traces are on the first major surface. Each first trace is connected at one end to the first metal bar. The plurality of first openings expose the dielectric layer on the first major surface and intersect a first trace. The second metal bar is on the second major surface. The at least one second opening exposes the dielectric layer on the second major surface and intersects the second metal bar. The first openings are laterally offset with respect to the at least one second opening.

20 Claims, 9 Drawing Sheets

US 10,937,709 B2

SUBSTRATES FOR SEMICONDUCTOR PACKAGES

BACKGROUND

Substrates for semiconductor packages may be formed in strips and include traces on one or both major surfaces of the substrate strip to electrically connect to a plurality of semiconductor dies, which are later singulated to provide a plurality of semiconductor packages. During the fabrication process of a substrate strip, the traces on a major surface of the substrate strip may be electrically connected to each other to enable a plating process to plate portions of the traces. Semiconductor dies may then be attached to the substrate strips and encapsulated with a mold material to provide semiconductor packages. Since the traces are electrically connected to each other, detecting unwanted shorts within the semiconductor packages (e.g., due to design or manufacturing defects) on a substrate strip may not be possible during strip testing.

For these and other reasons, a need exists for the present invention.

SUMMARY

One example of a substrate includes a dielectric layer, a first metal bar, a plurality of first traces, a plurality of first openings, a second metal bar, and at least one second opening. The dielectric layer has a first major surface and a second major surface opposite to the first major surface. The first metal bar is on the first major surface. The plurality of first traces are on the first major surface. Each first trace is connected at one end to the first metal bar. The plurality of first openings expose the dielectric layer on the first major surface and intersect a first trace. The second metal bar is on the second major surface. The at least one second opening exposes the dielectric layer on the second major surface and intersects the second metal bar. The first openings are laterally offset with respect to the at least one second opening.

One example of a semiconductor package includes a substrate and a semiconductor die. The substrate has a top surface and a bottom surface opposite to the top surface. The substrate includes a dielectric layer having a first major surface and a second major surface opposite to the first major surface. A plurality of first traces are on the first major surface. A plurality of openings are on the first major surface, where each opening intersects a first trace. The semiconductor die is arranged on the top surface of the substrate. At least a subset of the plurality of first traces are electrically coupled to the semiconductor die. A mold material may encapsulate the semiconductor die and at least the top surface of the substrate. The mold material may cover each opening and contact the first major surface such that the openings are not visible from outside the semiconductor package. The substrate may include a sidewall extending between the top surface and the bottom surface of the substrate. At least a portion of the plurality of first traces may be exposed at the sidewall of the substrate.

DETAILED DESCRIPTION

In the following Detailed Description, reference is made to the accompanying drawings, which form a part hereof, and in which is shown by way of illustration specific embodiments in which the disclosure may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present disclosure. The following detailed description, therefore, is not to be taken in a limiting sense, and the scope of the present disclosure is defined by the appended claims.

It is to be understood that the features of the various exemplary embodiments described herein may be combined with each other, unless specifically noted otherwise.

Disclosed herein are substrates for semiconductor packages. The substrate includes first openings intersecting first traces on a first major surface of the substrate and second openings intersecting a metal bar (e.g., plating bar) on a second major surface of the substrate. The first openings on the first major surface are laterally offset with respect to the second openings on the second major surface. In a semiconductor package utilizing the substrate, mold material covers the first openings such that the first opening are not visible from outside the semiconductor package. In addition, portions of the first traces remain exposed on sidewalls of the substrate after the molding process. The openings in the substrate enable strip testing for shorts within semiconductor packages fabricated on the substrate since the openings electrically disconnect the semiconductor packages from each other on the substrate strip. After the strip testing, the semiconductor packages may be singulated.

Figure 1A:
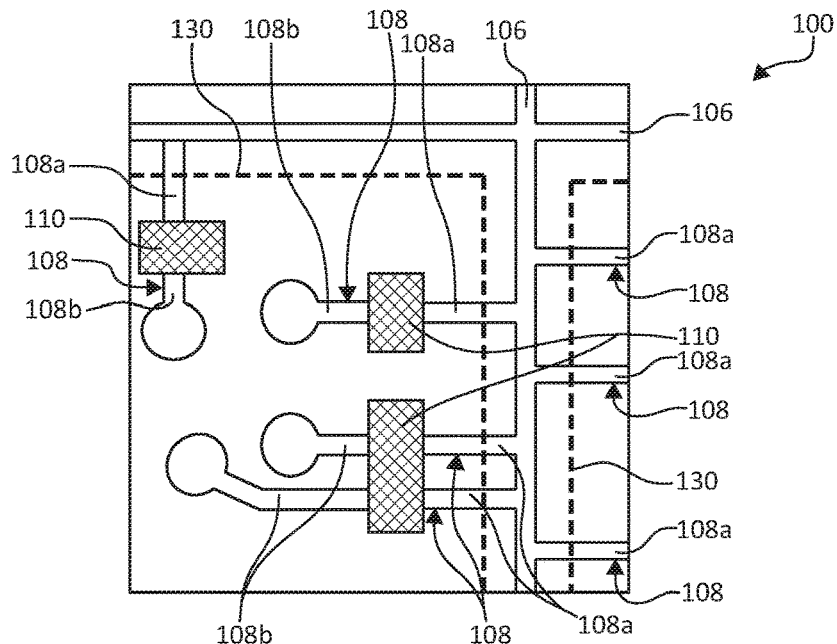
FIGS. 1A-1C illustrate one example of a substrate.
Figure 1B:
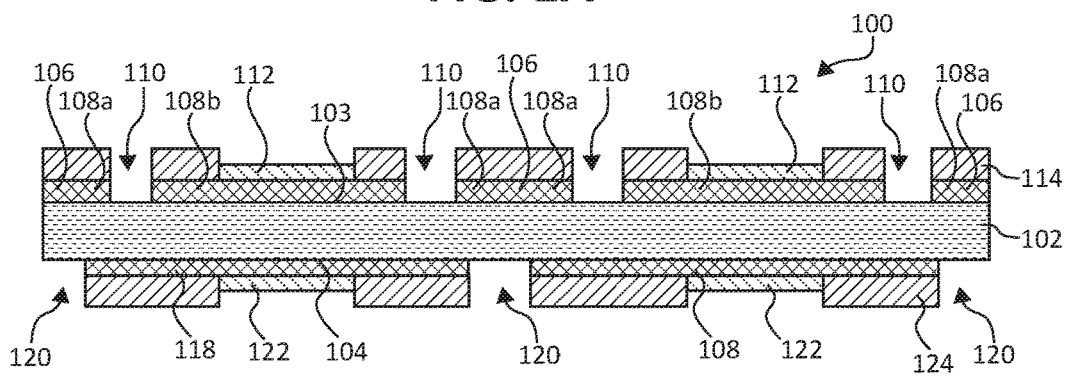
Figure 1C:
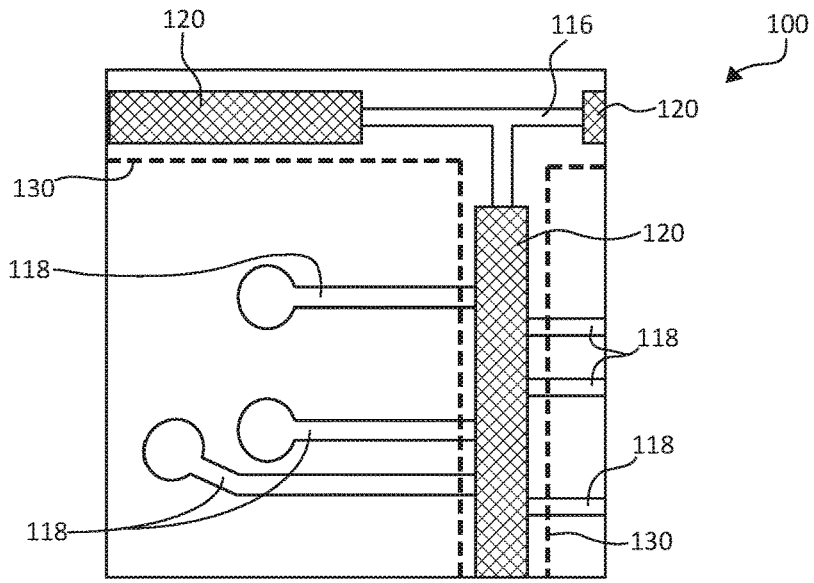

FIGS. 1A-1C illustrate one example of a substrate 100. FIG. 1A illustrates a top view of substrate 100, FIG. 1B illustrates a cross-sectional view of substrate 100, and FIG. 1C illustrates a bottom view of substrate 100. Substrate 100 includes a dielectric layer 102, a first metal bar (e.g., plating bar) 106, a plurality of first traces 108 (including portions 108a and 108b), a plurality of first openings 110, a second metal bar (e.g., plating bar) 116, optionally a plurality of second traces 118, and a plurality of second openings 120. Substrate 100 also includes first plating layers 112, second plating layers 122, a first resist layer or film layer 114, and a second resist layer or film layer 124.

The dielectric layer 102 may include a plastic material or another suitable insulating material. The dielectric layer 102 has a first major surface 103 and a second major surface 104 opposite to the first major surface 103. The first metal bar 106 may include Cu or another suitable metal. The first metal bar 106 is on the first major surface 102 of the dielectric layer 102. The plurality of first traces 108 may include Cu or another suitable metal. The plurality of first traces 108 are on the first major surface 102 of the dielectric layer 102. Each first trace 108 is connected at one end via portion 108a to the first metal bar 106. The first plating layer 112 may include Ni, Au, or another suitable metal. The first plating layers 112 may contact a portion of each first trace 108.

The plurality of first openings 110 expose the dielectric layer 102 on the first major surface 103. Each first opening 110 intersects at least one first trace 108, such that each first trace 108 is divided into a first portion 108a and a second portion 108b. The first resist layer or film layer 114 may include a solder resist, a dry film, or another suitable mask material. The first resist layer or film layer 114 is on a portion of each first trace 108, the first metal bar 106, and the first major surface 103 of the dielectric layer 102. The first resist layer or film layer 114 does not overlap with the plurality of first openings 110.

The second metal bar 116 may include Cu or another suitable metal. The second metal bar 116 is on the second major surface 104 of the dielectric layer 102. The plurality of second traces 118 may include Cu or another suitable metal. The plurality of second traces 118 are on the second major surface 104 of the dielectric layer 102. The second plating layers 122 may include Ni, Au, or another suitable metal. The second plating layers 122 may contact a portion of each second trace 118.

The plurality of second openings 120 expose the dielectric layer 102 on the second major surface 104. Each second opening 120 intersects the second metal bar 116, such that the second traces 118 are electrically disconnected from each other. As shown in FIG. 1B, the first openings 110 are laterally offset with respect to the second openings 120. The second resist layer or film layer 124 may include a solder resist, a dry film, or another suitable mask material. The second resist layer or film layer 124 is on a portion of each second trace 118, the second metal bar 116, and the second major surface 104 of the dielectric layer 102. The second resist layer or film layer 124 does not overlap with the plurality of second openings 120.

Substrate 100 includes package areas defined by dashed lines 130 (i.e., areas enclosed by dashed lines 130 are package areas). Substrate 100 includes singulation areas between the package areas. The first openings 110 are within the package areas and spaced apart from edges 130 of the package areas. The second openings 120 are within the singulation areas. The arrangement of the first openings 110 and the second openings 120 enables open/short testing at the substrate strip level.

Figure 2A:
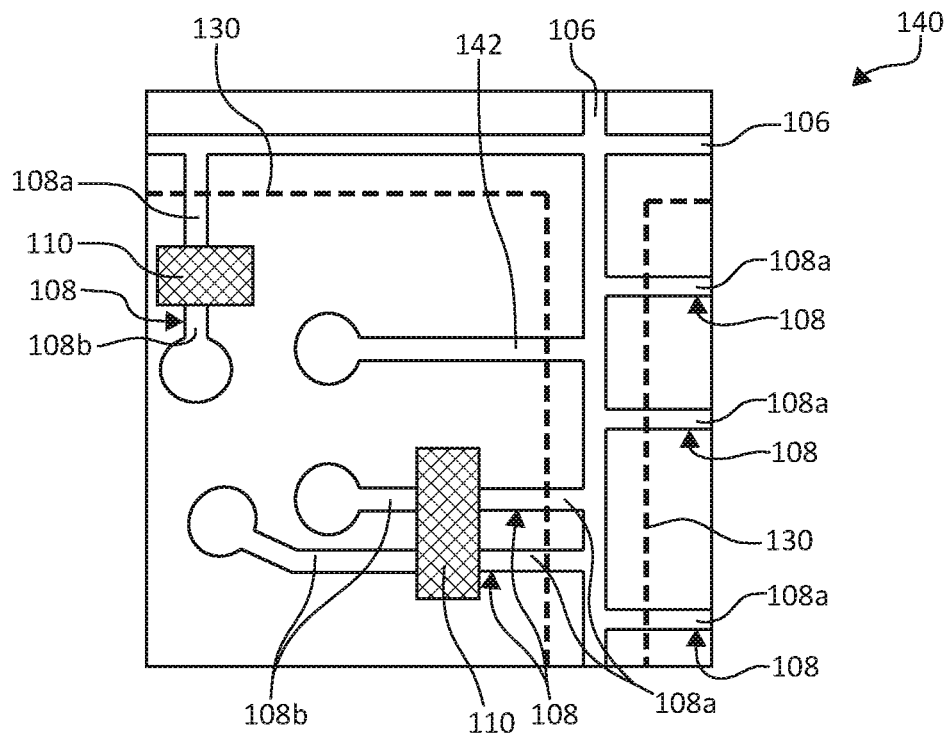
FIGS. 2A-2B illustrate another example of a substrate.
Figure 2B:
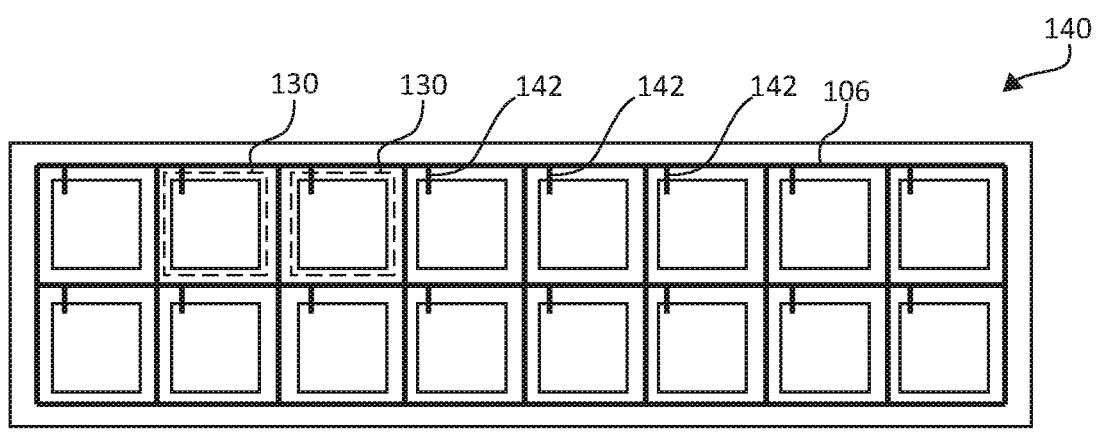

FIGS. 2A-2B illustrate another example of a substrate 140. FIG. 2A illustrates a top view of a portion of substrate 140 and FIG. 2B illustrates a top view of substrate 140 (e.g., a substrate strip). Substrate 140 is similar to substrate 100 previously described and illustrated with reference to FIGS. 1A-1C, except that substrate 140 includes a trace 142 on the first major surface 103 of the dielectric layer 102 that is electrically coupled to the first metal bar 106. As shown in FIG. 2B, each individual package area 130 of a substrate strip may include a trace 142. The trace 142 enables an electrical continuity wire bond check against wire bonds that do not properly stick on the chip pad (leading to an open circuit). This check is generally called a "none-stick on pad" (NSOP) detection function.

Figure 3:
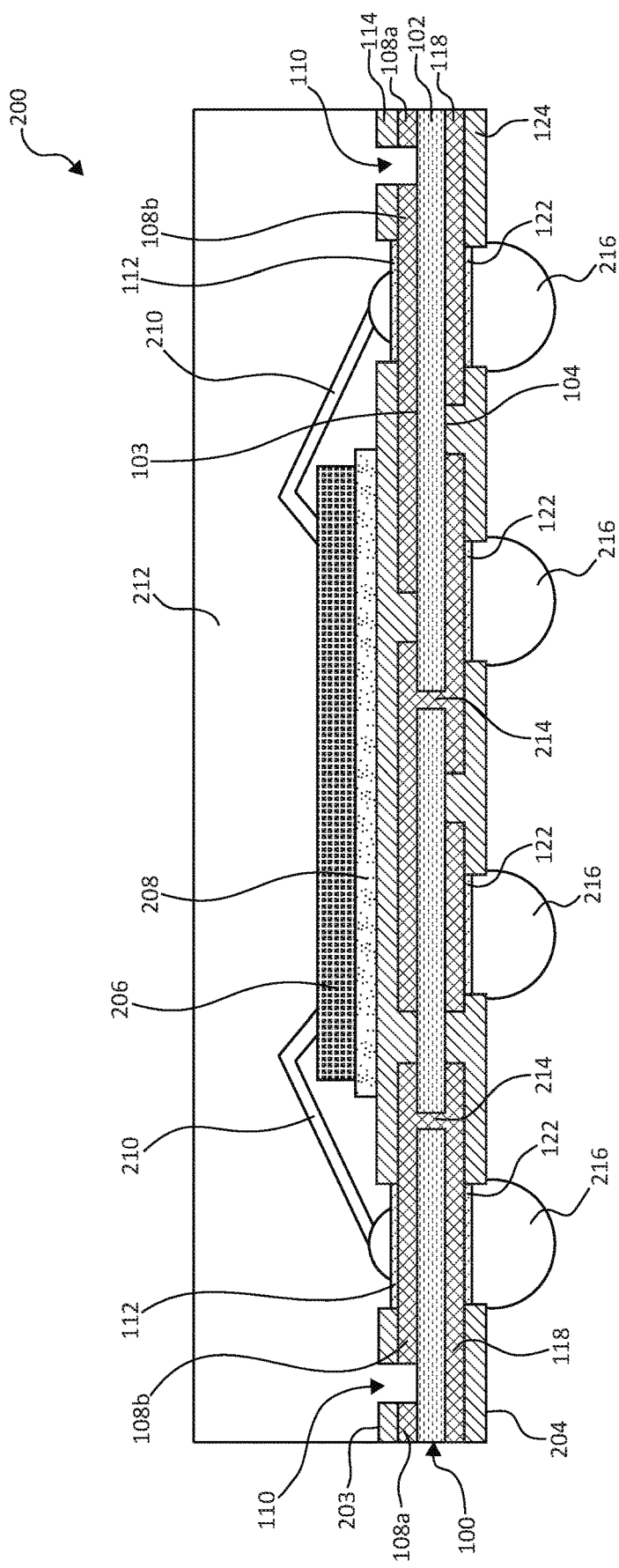
FIG. 3 illustrates one example of a semiconductor package.

FIG. 3 illustrates one example of a semiconductor package 200. Semiconductor package 200 includes a substrate 100, a semiconductor die 206, an attachment material 208, a plurality of wire bonds 210, a mold material 212, a redistribution layer 214, and solder balls 216. The substrate 100 has a top surface 203 and a bottom surface 204 opposite to the top surface 203. As previously described with reference to FIGS. 1A-1C, substrate 100 includes a dielectric layer 102, a plurality of first traces 108, and a plurality of openings 110. The dielectric layer 102 has a first major surface 103 and a second major surface 104 opposite to the first major surface 103. The plurality of first traces 108 are on the first major surface 103. The plurality of openings 110 are on the first major surface 102 and each opening intersects a first trace 108, such that each first trace 108 is divided into a first portion 108a and a second portion 108b. The resist layer 114 is on portions of each first trace 108 and the first major surface 103 and each opening 110 extends through the resist layer 114.

The semiconductor die 206 is arranged on the top surface 203 of the substrate 100 and attached to substrate 100 via attachment material 208. Attachment material 208 may include solder, glue, or another suitable adhesive material. At least a subset of the plurality of first traces 108 are electrically coupled to the semiconductor die 206. In this example, the plurality of wire bonds 210 electrically couple the semiconductor die 206 to at least the subset of the plurality of first traces 108 via the first plating layers 112. The redistribution layer 214 extends through the dielectric layer 102 of the substrate 100 and electrically couples at least one first trace 108 to a second trace 118. The second traces 118 are coupled to the solder balls 216 via second plating layers 122.

The mold material 212 encapsulates the semiconductor die 206, the attachment material 208, the wire bonds 210, and at least the top surface 203 of the substrate 100. The mold material 212 covers each opening 110 and contacts the first major surface 103 of the dielectric layer 102 such that the openings 110 are not visible from outside the semiconductor package 200. The substrate 100 includes a sidewall extending between the top surface 203 and the bottom surface 204. At least portions 108a of the plurality of first traces 108 are exposed at the sidewall of the substrate 100.

Figure 4:
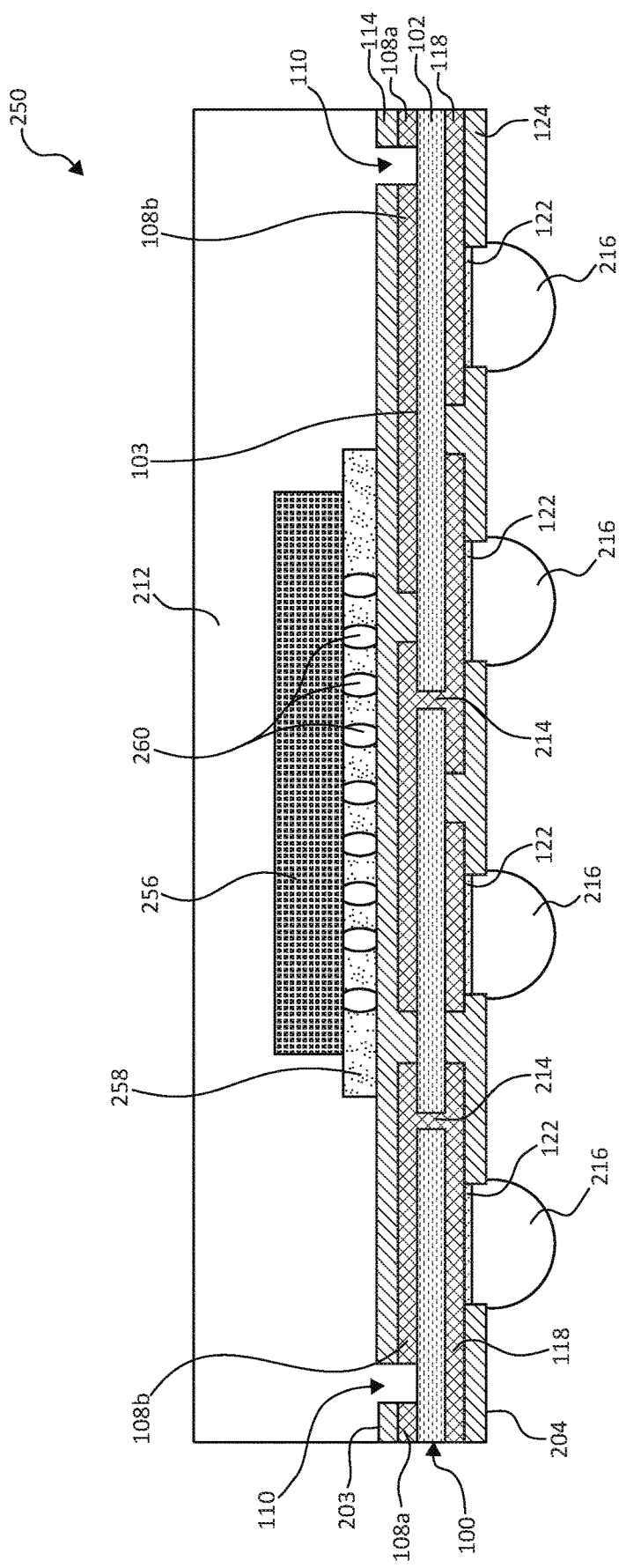
FIG. 4 illustrates another example of a semiconductor package.

FIG. 4 illustrates another example of a semiconductor package 250. Semiconductor package 250 is similar to semiconductor package 200 previously described and illustrated with reference to FIG. 3, except that semiconductor package 250 has a flip chip configuration rather than wire bonds. In this example, a semiconductor die 256 is electrically coupled to at least a subset of the plurality of first traces 108 in a flip chip configuration through solder connections 260. An underfill material 258 fills the remaining space between the semiconductor die 256 and the substrate 100.

Figure 5A:
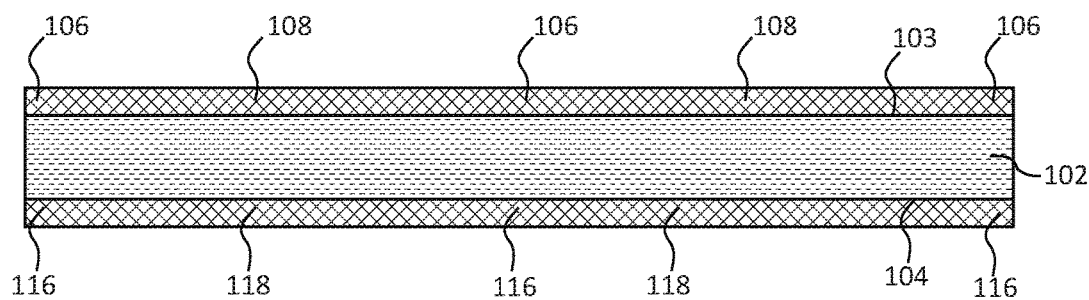
FIGS. 5A-5I illustrate one example of a method for fabricating a substrate.

FIGS. 5A-5I illustrate one example of a method for fabricating a substrate. Each FIG. 5A-5I is a cross-sectional view illustrating a step in the method, which may be used to fabricate substrate 100 previously described and illustrated with reference to FIGS. 1A-1C. As illustrated in FIG. 5A, the method includes forming first traces 108 coupled to a first metal bar 106 on a first major surface 103 of a dielectric layer 102. In addition, the method includes forming second traces 118 coupled to a second metal bar 116 on a second major surface 104 of the dielectric layer 102 opposite to the first major surface 103. The first traces 108, the first metal bar 106, the second traces 118, and the second metal bar 116 may be formed using photolithography and etching processes, printing, or other suitable processes.

Figure 5B:
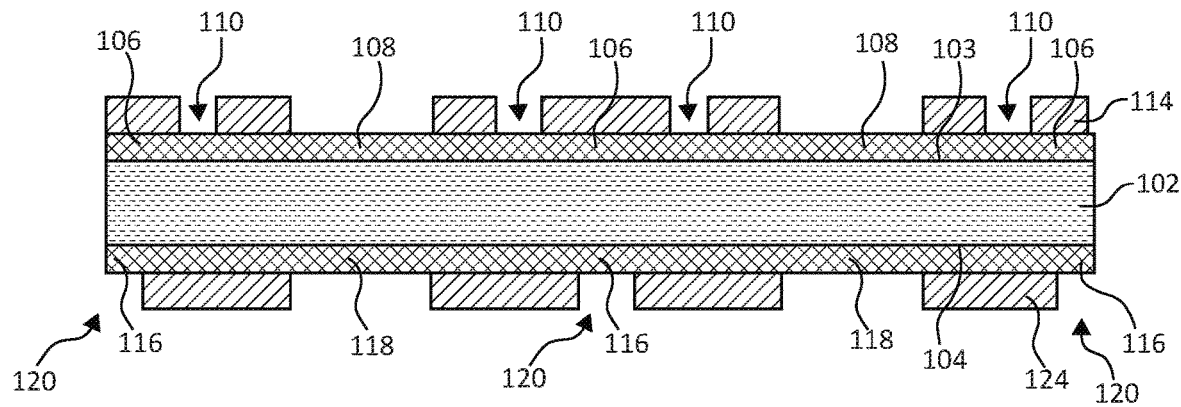

As illustrated in FIG. 5B, the method includes applying a first resist layer (e.g., solder mask material) 114 over the first traces 108, the first metal bar 106, and the first major surface 103 and structuring the resist layer 114 to expose portions of at least a subset of the first traces 108 to define preliminary first openings 110 and first areas to be plated. The method also includes applying a second resist layer (e.g., solder mask material) 124 over the second traces 118, the second metal bar 116, and the second major surface 104 and structuring the second resist layer 124 to expose portions of the second traces 118 and the second metal bar 116 to define preliminary second openings 120 and second areas to be plated. The first resist layer 114 and the second resist layer 124 may be formed using photolithography and etching processes or other suitable processes.

Figure 5C:
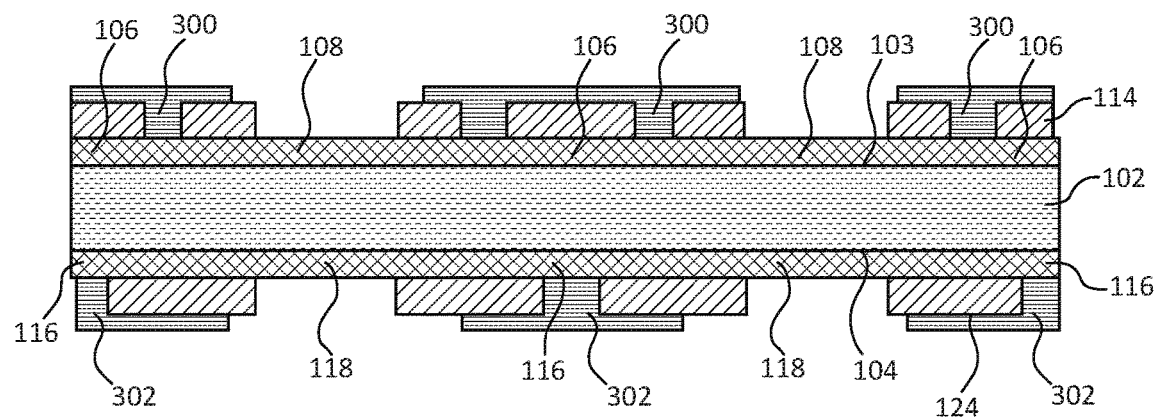
Figure 5D:
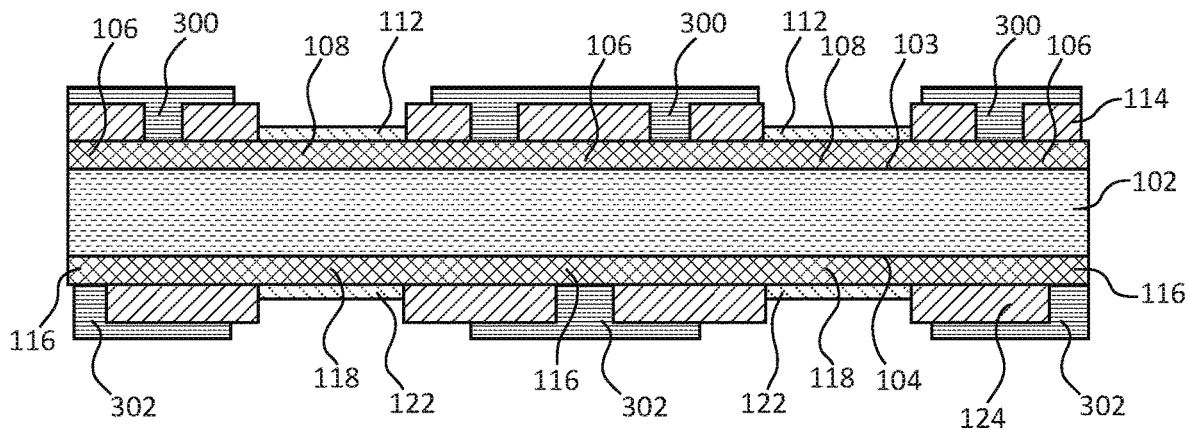
Figure 5E:
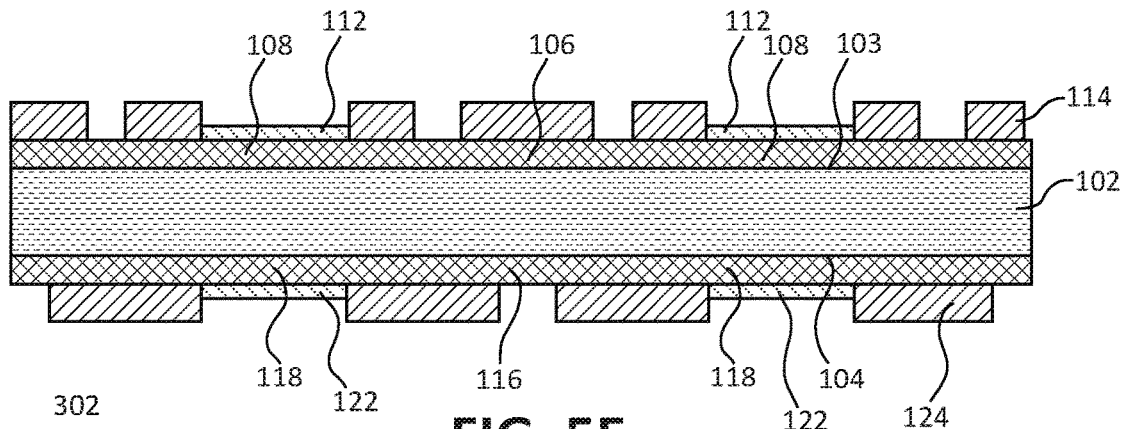

As illustrated in FIG. 5C, the method includes forming a first mask (e.g., LPI mask) 300 over portions of the first traces 108, the first metal bar 106, and the first resist layer 114 to mask the preliminary first openings 110. In addition, the method includes forming a second mask (e.g., LPI mask) 302 over portions of the second traces 118, the second metal bar 116, and the second resist layer 124 to mask the preliminary second openings 120. As illustrated in FIG. 5D, the method includes plating the exposed portions of the first traces 108 to form first plating layers 112 and plating the exposed portions of the second traces 118 to form second plating layers 122. As illustrated in FIG. 5E, the first mask 300 and the second mask 302 are removed (i.e., stripped).

Figure 5F:
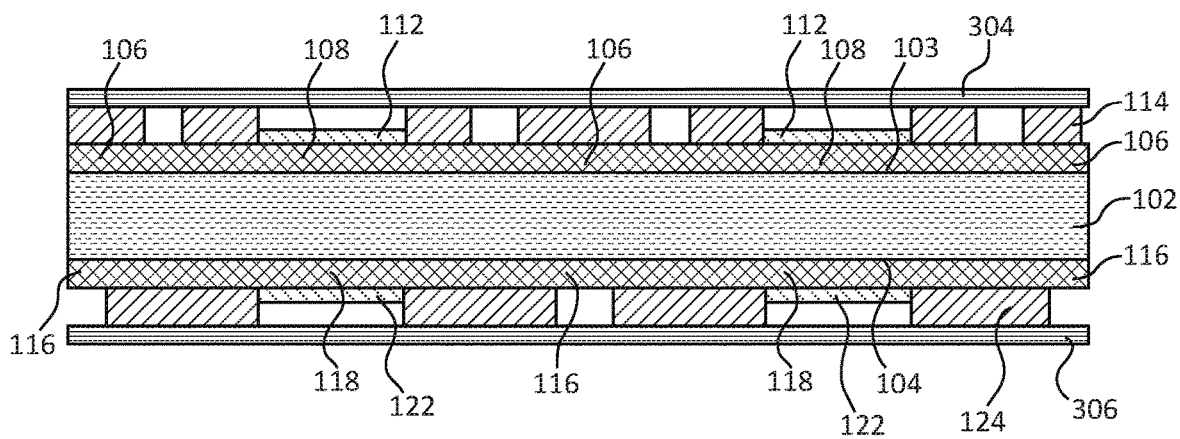
Figure 5G:
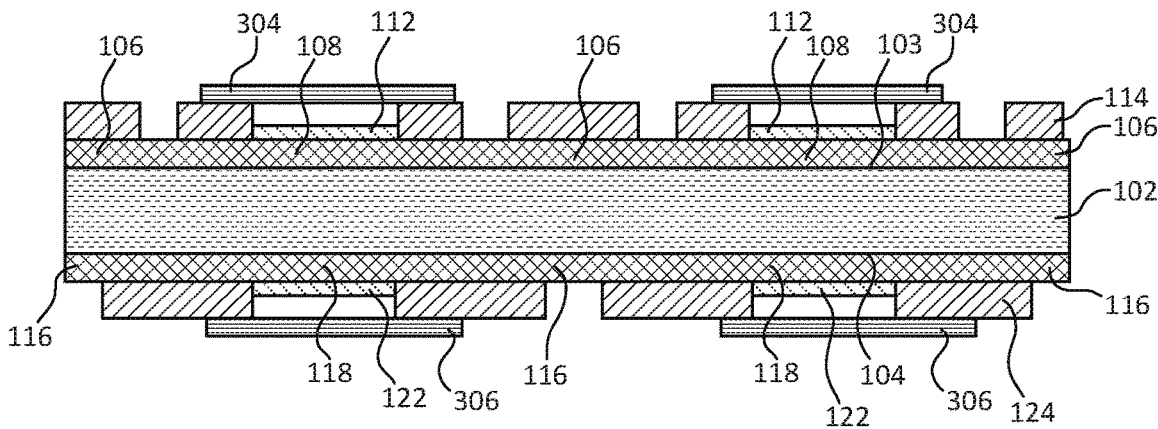

As illustrated in FIG. 5F, the method includes applying a first dry film 304 over the first resist layer 114 and a second dry film 306 over the second resist layer 124. As illustrated in FIG. 5G, the method includes structuring (e.g., via a dry film expose and develop) the first dry film 304 such that the first plating layers 112 remain covered and structuring the second dry film 306 such that the second plating layers 122 remain covered.

Figure 5H:
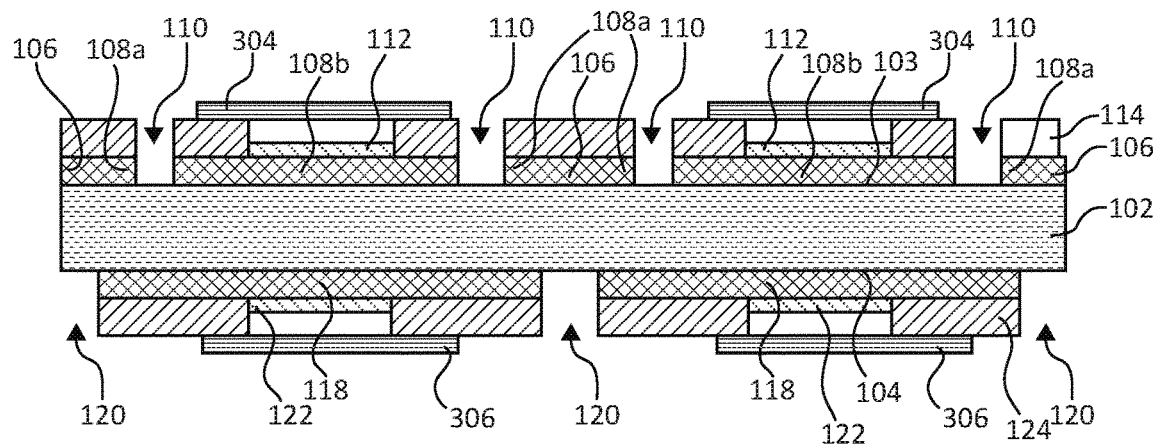
Figure 5I:
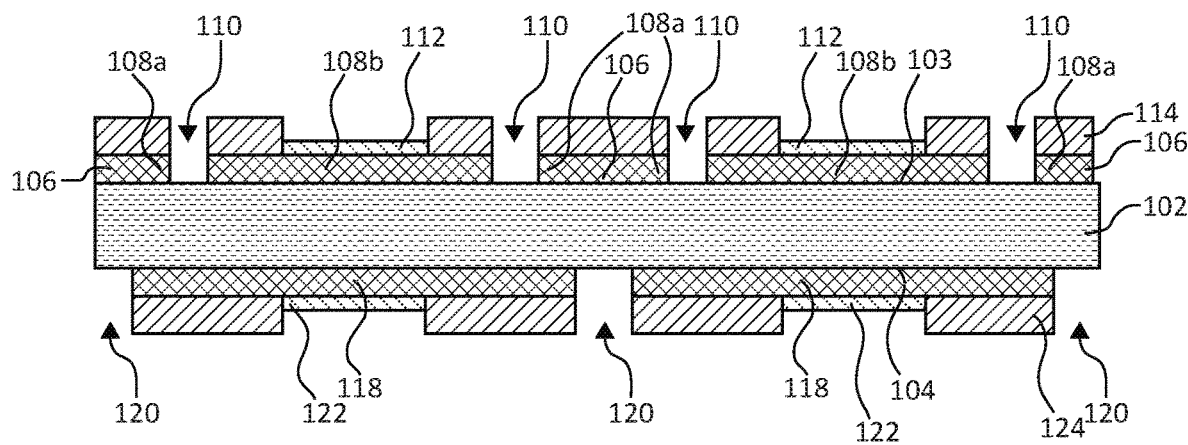

As illustrated in FIG. 5H, the method includes etching the exposed portions of at least a subset of the first traces 108 to define completed first openings 110 exposing portions of the first major surface 103 of the dielectric layer 102. In addition, the method includes etching the exposed portions of the second metal bar 116 and the second traces 118 to define completed second openings 120 exposing portions of the second major surface 104 of the dielectric layer 102. The first openings 110 are latterly offset with respect to the second openings 120. The first openings 110 may be within package areas of the substrate and the second openings 120 may be within singulation areas of the substrate. In one example, the method includes etching portions of a first subset of the first traces 108 such that a second subset of the first traces 108 remain coupled to the first metal bar 106 (e.g., see FIGS. 2A-2B). As illustrated in FIG. 5I, the method includes removing the first dry film 304 and the second dry film 306 to complete the fabrication of the substrate 100.

Figure 6A:
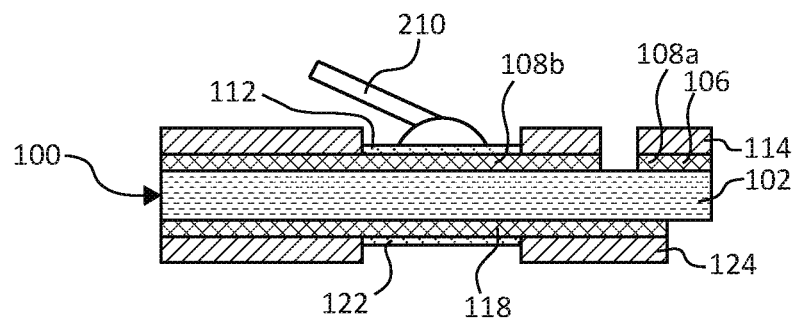
FIGS. 6A-6E illustrate one example of a method for fabricating a semiconductor package.
Figure 6B:
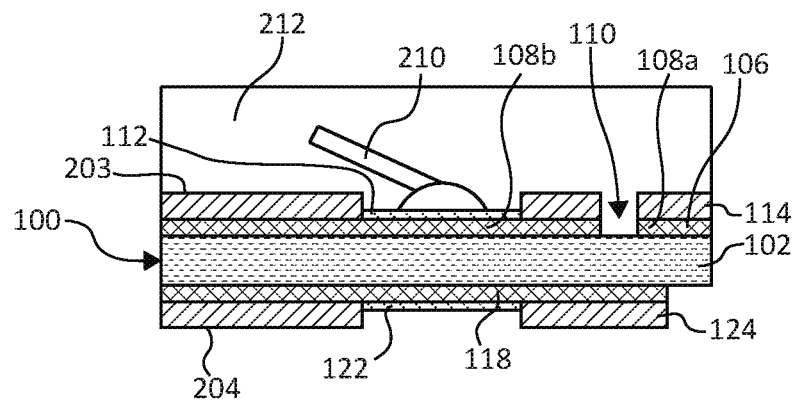

FIGS. 6A-6E illustrate one example of a method for fabricating a semiconductor package. Each FIG. 6A-6E is a cross-sectional view illustrating a step in the method, which may be used to fabricate semiconductor package 200 previously described and illustrated with reference to FIG. 3. As illustrated in FIG. 6A, after attaching a semiconductor die (not shown) to the substrate 100, the method includes attaching wire bonds 210 to electrically couple the semiconductor die to the portions 108b of the first traces 108 via first plating layers 112. As illustrated in FIG. 6B, the method includes applying a mold material over the semiconductor die, the wire bonds 210, and at least the top surface 203 of the substrate 100. The mold material fills the first openings 110 such that the first openings are not visible from outside of the semiconductor package.

Figure 6C:
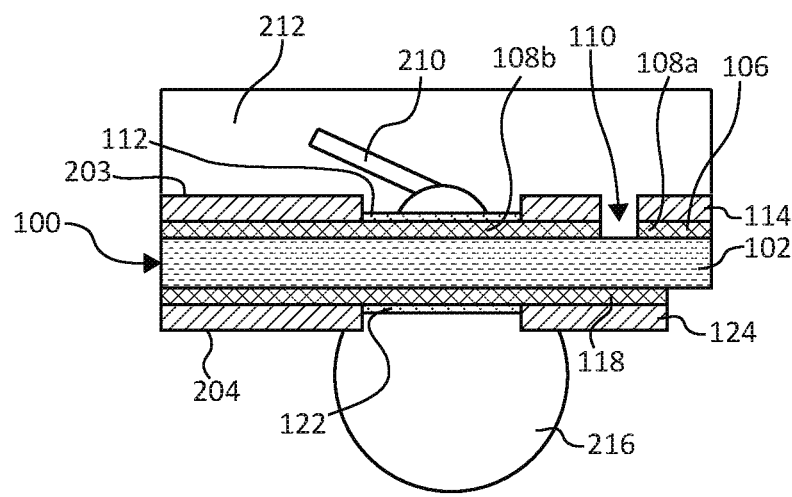
Figure 6D:
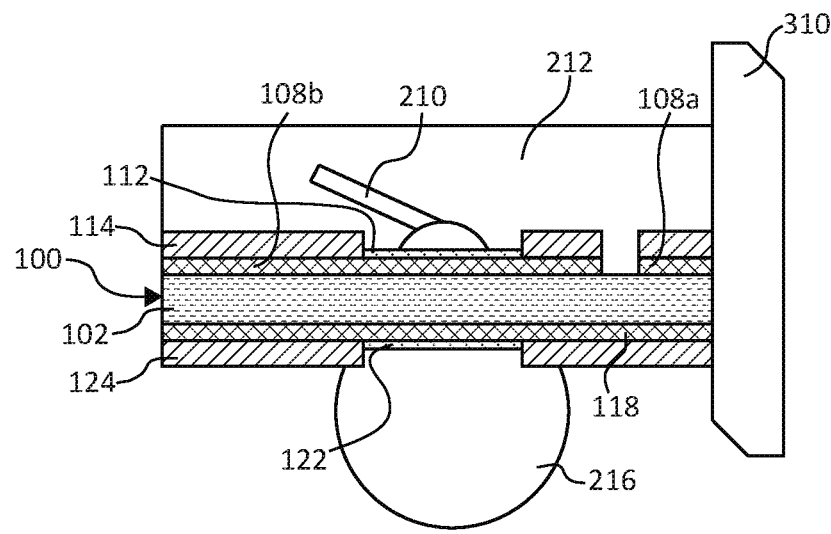
Figure 6E:
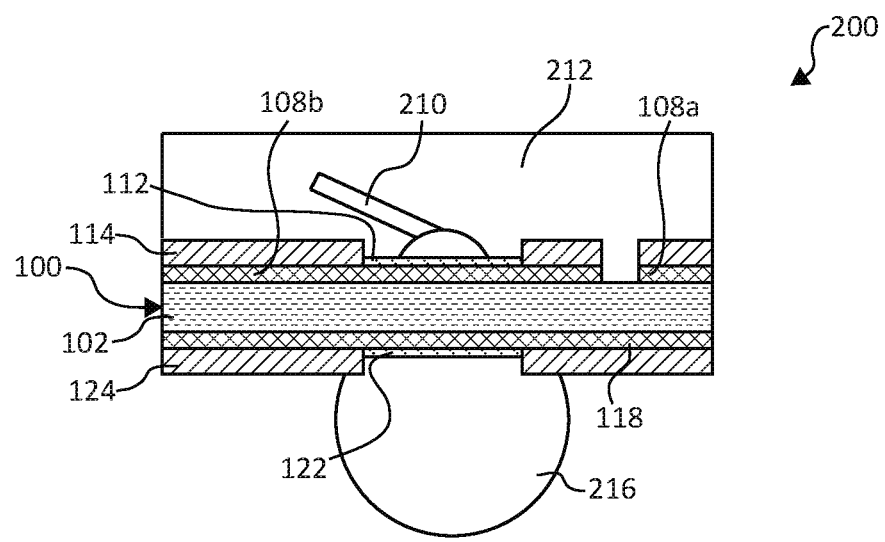

As illustrated in FIG. 6C, solder balls 216 are attached to the second traces 118 via the second plating layers 122. As illustrated in FIG. 6D, the method includes singulating the semiconductor packages from each other using a blade 310 as illustrated, or by using another suitable singulation process such as laser cutting. During the singulation process, the first metal bar 106 may be removed leaving the portion 108a of each first trace 108 electrically isolated. After singulation, the semiconductor package 200 is complete as illustrated in FIG. 6E.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

What is claimed is:

1. A substrate comprising:
    a dielectric layer having a first major surface and a second major surface opposite to the first major surface;
    a first metal bar on the first major surface;
    a plurality of first traces on the first major surface, each first trace separated into a first portion and a second portion, the first portion connected to the first metal bar;
    a plurality of first openings on the first major surface, each first opening intersecting a first trace and dividing the first trace into the first portion and the second portion;
    a second metal bar on the second major surface; and
    at least one second opening on the second major surface, the at least one second opening intersecting the second metal bar,
    wherein the first openings are laterally offset from the at least one second opening with respect to the dielectric layer.

2. The substrate of claim 1, wherein the substrate comprises package areas and singulation areas between the package areas, and
    wherein the first openings are within the package areas and spaced apart from edges of the package areas, and the at least one second opening is within the singulation areas.

3. The substrate of claim 1, further comprising:
    a resist layer on a portion of each first trace and the first major surface,
    wherein the resist layer does not overlap with the plurality of first openings.

4. The substrate of claim 1, further comprising:
    a film layer on a portion of each first trace and the first major surface,
    wherein the film layer does not overlap with the plurality of first openings.

5. The substrate of claim 1, further comprising:
    a second trace on the first major surface, the second trace electrically coupled to the first metal bar.

6. The substrate of claim 1, further comprising:
    a plurality of further traces on the second major surface.

7. A semiconductor package comprising:
    a substrate having a top surface and a bottom surface opposite to the top surface, the substrate comprising:
        a dielectric layer having a first major surface and a second major surface opposite to the first major surface;
        a plurality of first traces on the first major surface; and
        a plurality of openings on the first major surface, each opening intersecting a first trace; and
    a semiconductor die arranged on the top surface of the substrate, wherein at least a subset of the plurality of first traces are electrically coupled to the semiconductor die.

8. The semiconductor package of claim 7, further comprising:
a mold material encapsulating the semiconductor die and at least the top surface of the substrate.

9. The semiconductor package of claim 8, wherein the mold material covers each opening and contacts the first major surface such that the openings are not visible from outside the semiconductor package.

10. The semiconductor package of claim 8, wherein the substrate comprises a sidewall extending between the top surface and the bottom surface of the substrate, and
wherein at least a portion of the plurality of first traces are exposed at the sidewall of the substrate.

11. The semiconductor package of claim 8, further comprising:
a redistribution layer through the dielectric layer of the substrate electrically coupling at least one first trace to a second trace arranged on the second major surface.

12. The semiconductor package of claim 7, further comprising:
a plurality of wire bonds electrically coupling the semiconductor die to at least the subset of the plurality of first traces.

13. The semiconductor package of claim 7, further comprising:
solder electrically coupling the semiconductor die to at least the subset of the plurality of first traces in a flip chip configuration.

14. The semiconductor package of claim 7, further comprising:
a resist layer on portions of each first trace and the first major surface,
wherein each opening extends through the resist layer.

15. A method for fabricating a substrate, the method comprising:
forming first traces coupled to a first metal bar on a first major surface of a dielectric layer;
forming second traces coupled to a second metal bar on a second major surface of the dielectric layer opposite to the first major surface; and
etching portions of at least a subset of the first traces to define first openings exposing portions of the first major surface and etching at least portions of the second metal bar to define second openings exposing portions of the second major surface such that the first openings are laterally offset from the second openings with respect to the dielectric layer.

16. The method of claim 15, further comprising:
plating a portion of each first trace and a portion of each second trace.

17. The method of claim 16, further comprising:
applying a first dry film over the plated portions of the first traces and a second dry film over the plated portions of the second traces.

18. The method of claim 16, further comprising:
applying a first resist layer over the first traces and the first major surface and applying a second resist layer over the second traces and the second major surface; and
structuring the first resist layer to expose portions of at least the subset of the first traces and structuring the second resist layer to expose portions of the second metal bar prior to etching to define the first openings and the second openings.

19. The method of claim 15, wherein the first openings are within package areas of the substrate and the second openings are within singulation areas of the substrate.

20. The method of claim 15, wherein etching portions of at least the subset of the first traces comprises etching portions of a first subset of the first traces such that a second subset of the first traces remain coupled to the first metal bar.

* * * * *